(12) United States Patent
Li (10) Patent No.: US 11,121,330 B2
(45) Date of Patent: Sep. 14, 2021

(54) ORGANIC LIGHT-EMITTING DIODE DISPLAY PANEL AND DISPLAY DEVICE HAVING SUBSTRATE THROUGH HOLES

(71) Applicant: WUHAN CHINA STAR OPTOELECTRONICS SEMICONDUCTOR DISPLAY TECHNOLOGY CO., LTD., Wuhan (CN)

(72) Inventor: Wenqi Li, Wuhan (CN)

(*) Notice: Subject to any disclaimer, the term of this patent is extended or adjusted under 35 U.S.C. 154(b) by 128 days.

(21) Appl. No.: 16/497,446

(22) PCT Filed: Aug. 15, 2019

(86) PCT No.: PCT/CN2019/100833
§ 371 (c)(1),
(2) Date: Sep. 25, 2019

(87) PCT Pub. No.: WO2020/237841
PCT Pub. Date: Dec. 3, 2020

(65) Prior Publication Data
US 2020/0403168 A1    Dec. 24, 2020

(30) Foreign Application Priority Data
May 30, 2019    (CN) .......................... 201910464059.9

(51) Int. Cl.
*H01L 51/00* (2006.01)
*H01L 51/52* (2006.01)
(Continued)

(52) U.S. Cl.
CPC ........ *H01L 51/0096* (2013.01); *G06K 9/0004* (2013.01); *H01L 27/3248* (2013.01);
(Continued)

(58) Field of Classification Search
CPC ............. H01L 51/0096; H01L 51/5253; H01L 51/5271; H01L 27/3248; H01L 27/3276;
(Continued)

(56) References Cited

U.S. PATENT DOCUMENTS 10,417,477 B2 *   9/2019   Ko ........................... G02B 6/08
10,558,834 B2 *   2/2020   Sun ...................... G06K 9/0004
(Continued)

FOREIGN PATENT DOCUMENTS

CN        106298859 A      1/2017
CN        107451576 A     12/2017
(Continued)

*Primary Examiner* — Ida M Soward (57) ABSTRACT

An organic light-emitting diode (OLED) display panel and a display device are provided. The OLED display panel includes a substrate, a driving circuit layer formed on a side of the substrate, a light-emitting material layer formed on a side of the driving circuit layer away from the substrate, a sensing unit formed on another side of the substrate away from the driving circuit layer and configured to receive light reflected by a fingerprint surface. In a fingerprint identifying region of the OLED display panel, the substrate includes a through hole, and the light emitted from the light-emitting material layer and reflected by the fingerprint surface travels through the through hole and arrivals the sensing unit.

12 Claims, 6 Drawing Sheets

(51) Int. Cl.
  *H01L 27/32*    (2006.01)
  *H01L 27/14*    (2006.01)
  *G06K 9/00*     (2006.01)
  *H01L 25/18*    (2006.01)
  *H01L 27/146*   (2006.01)

(52) U.S. Cl.
  CPC ...... *H01L 27/3276* (2013.01); *H01L 51/5253* (2013.01); *H01L 51/5271* (2013.01); *H01L 25/18* (2013.01); *H01L 27/14678* (2013.01); *H01L 27/323* (2013.01)

(58) Field of Classification Search
  CPC ............ H01L 27/14678; H01L 27/323; G06K 9/0004
  See application file for complete search history.

(56)           References Cited

U.S. PATENT DOCUMENTS

| | | | |
|---|---|---|---|
| 10,599,939 B2 * | 3/2020 | Gu | G06K 9/00087 |
| 10,664,680 B2 * | 5/2020 | Xu | G02B 27/30 |
| 10,803,285 B2 * | 10/2020 | Zhao | H01L 27/3227 |
| 2019/0147214 A1 | 5/2019 | Lee et al. | |
| 2019/0156097 A1 | 5/2019 | Liu et al. | |
| 2019/0180073 A1 | 6/2019 | Zhang et al. | |
| 2020/0074139 A1 * | 3/2020 | Zhou | H01L 27/3272 |
| 2020/0202099 A1 * | 6/2020 | Sun | G06K 9/0004 |
| 2021/0181860 A1 * | 6/2021 | Ye | G06F 3/0202 |

FOREIGN PATENT DOCUMENTS

| | | |
|---|---|---|
| CN | 107994034 A | 5/2018 |
| CN | 109273497 A | 1/2019 |

* cited by examiner

ORGANIC LIGHT-EMITTING DIODE DISPLAY PANEL AND DISPLAY DEVICE HAVING SUBSTRATE THROUGH HOLES

FIELD OF DISCLOSURE

The present disclosure relates to the field of display technologies, and in particular, to an organic light-emitting diode (OLED) display panel and a display device.

BACKGROUND

In recent years, a technology of optical fingerprint identification under a screen has become the hottest frontier technology research and development topic. Corresponding to an OLED display device, when a specific area of a screen is touched by a finger, light emitted by the OLED is reflected by the finger, and then the light travels through each film layer of the OLED display panel and arrivals a sensing integrated circuit (IC) placed on a back of the display panel. The sensing IC compares the fingerprint information of a user to unlock the OLED display device.

However, the OLED display panel is formed by a multilayer process. When light passes through each layer, a part of it is lost, so that the light loss is large when the light arrivals the sensing IC on the back of the display panel, thereby resulting in poor fingerprint identification.

Therefore, the existing OLED display panel has a technical problem that the light transmittance is low, which needs to be improved.

SUMMARY OF DISCLOSURE

The present disclosure provides an OLED display panel and a display device to solve the technical problem that the existing OLED display panel has low transmittance.

In order to solve the above problems, the technical solution provided by the present disclosure is as follows.

The present disclosure provides an organic light-emitting diode (OLED) display panel, including:

a substrate;

a driving circuit layer formed on a side of the substrate;

a light-emitting material layer formed on a side of the driving circuit layer away from the substrate; and a sensing unit disposed on another side of the substrate away from the driving circuit layer and configured to receive light reflected by a fingerprint surface.

In a fingerprint identifying region of the OLED display panel, the substrate includes a through hole, and the light emitted from the light-emitting material layer and reflected by the fingerprint surface travels through the through hole and arrivals the sensing unit.

In the OLED display panel of the present disclosure, in the fingerprint identifying region, the driving circuit layer is unpatterned.

In the OLED display panel of the present disclosure, in the fingerprint identifying region, the substrate includes a plurality of first through holes that are not in contact with each other.

In the OLED display panel of the present disclosure, in the fingerprint identifying region, the substrate includes a central region and a peripheral region, and the peripheral region surrounds the central region, and a density of the first through holes in the central region is greater than a density of the first through holes in the peripheral region.

In the OLED display panel of the present disclosure, the plurality of first through holes are disposed at equal distances from each other.

In the OLED display panel of the present disclosure, the OLED display panel also includes a protection layer disposed on the another side of the substrate away from the driving circuit layer, and in the fingerprint identification region, the protection layer includes a plurality of second through holes which are in one-to-one correspondence with the first through holes.

In the OLED display panel of the present disclosure, in the fingerprint identification region, the substrate includes a third through hole.

In the OLED display panel of the present disclosure, the OLED display panel also includes a protection layer disposed on the another side of the substrate away from the driving circuit layer, and in the fingerprint identification region, the protection layer includes a fourth through hole corresponding to the third through hole.

In the OLED display panel of the present disclosure, the driving circuit layer includes a gate layer, a source and drain layer, and a signal line layer, and in the fingerprint identifying region, the driving circuit layer is patterned to form a fifth through hole, and the substrate includes a sixth through hole, and the light emitted from the light-emitting material layer and reflected by the fingerprint surface travels through the fifth through hole and arrivals the sixth through hole and the sensing unit according to a pinhole imaging theory.

In the OLED display panel of the present disclosure, the fifth through hole is formed with the gate layer.

In the OLED display panel of the present disclosure, the gate layer includes a first gate layer and a second gate layer, and the fifth through hole is formed with the first gate layer.

In the OLED display panel of the present disclosure, the gate layer includes a first gate layer and a second gate layer, and the fifth through hole is formed with the first gate layer.

In the OLED display panel of the present disclosure, the fifth through hole is formed with the source and drain layer.

In the OLED display panel of the present disclosure, the fifth through hole is formed with the signal line layer.

In the OLED display panel of the present disclosure, the OLED display panel also includes a protection layer disposed on the another side of the substrate away from the driving circuit layer, and in the fingerprint identification region, the protection layer includes a seventh through hole corresponding to the sixth through hole.

The present disclosure also provides a display device including an organic light-emitting diode (OLED) display panel. The OLED display panel includes:

a substrate;

a driving circuit layer formed on a side of the substrate;

a light-emitting material layer formed on a side of the driving circuit layer away from the substrate; and a sensing unit disposed on another side of the substrate away from the driving circuit layer and configured to receive light reflected by a fingerprint surface.

In a fingerprint identifying region of the OLED display panel, the substrate includes a through hole, and the light emitted from the light-emitting material layer and reflected by the fingerprint surface travels through the through hole and arrivals the sensing unit.

In the OLED display panel of the present disclosure, in the fingerprint identifying region, the driving circuit layer is unpatterned.

In the OLED display panel of the present disclosure, in the fingerprint identifying region, the substrate includes a plurality of first through holes that are not in contact with each other.

In the OLED display panel of the present disclosure, in the fingerprint identification region, the substrate includes a third through hole.

In the OLED display panel of the present disclosure, the driving circuit layer includes a gate layer, a source and drain layer, and a signal line layer, and in the fingerprint identifying region, the driving circuit layer is patterned to form a fifth through hole, and the substrate includes a sixth through hole, and the light emitted from the light-emitting material layer and reflected by the fingerprint surface travels through the fifth through hole and arrivals the sixth through hole and the sensing unit according to a pinhole imaging theory.

Advantages of the present disclosure are as follows. The present disclosure provides the OLED display panel and the display device. The OLED display panel includes the substrate, the driving circuit layer, the light-emitting material layer, and the sensing unit. The driving circuit layer is formed on a side of the substrate. The light-emitting material layer is formed on a side of the driving circuit layer away from the substrate. The sensing unit is disposed on another side of the substrate away from the driving circuit layer and configured to receive light reflected by the fingerprint surface. In the fingerprint identifying region of the OLED display panel, the substrate includes a through hole. The light emitted from the light-emitting material layer and reflected by the fingerprint surface travels through the through hole and arrivals the sensing unit. By forming the through hole on the substrate corresponding to the fingerprint identification region, a transmittance of the substrate in the fingerprint identifying region is increased, so that a path loss of the light emitted by the light-emitting material layer and reduced by the fingerprint surface to the sensing unit is reduced, thereby enhancing a performance of fingerprint identification.

BRIEF DESCRIPTION OF DRAWINGS

In order to more clearly describe the technical solutions of the embodiments of the present disclosure, the drawings to be used in the descriptions of the embodiments will be briefly introduced as follows. Apparently, the following drawings just illustrate some embodiments of the present disclosure, and a person skilled in the art can obtain other drawings based on these drawings without creative efforts.

DETAILED DESCRIPTION

The following embodiments are referring to the accompanying drawings for exemplifying specific implementable embodiments of the present disclosure. Furthermore, directional terms described by the present disclosure, such as upper, lower, front, back, left, right, inner, outer, side and etc., are only directions by referring to the accompanying drawings, and thus the used directional terms are used to describe and understand the present disclosure, but the present disclosure is not limited thereto. In the drawings, elements with the similar structure are labeled with the same reference numerals.

The present disclosure provides an OLED display panel and a display device to solve the technical problem that the existing OLED display panel has low transmittance.

Figure 1:
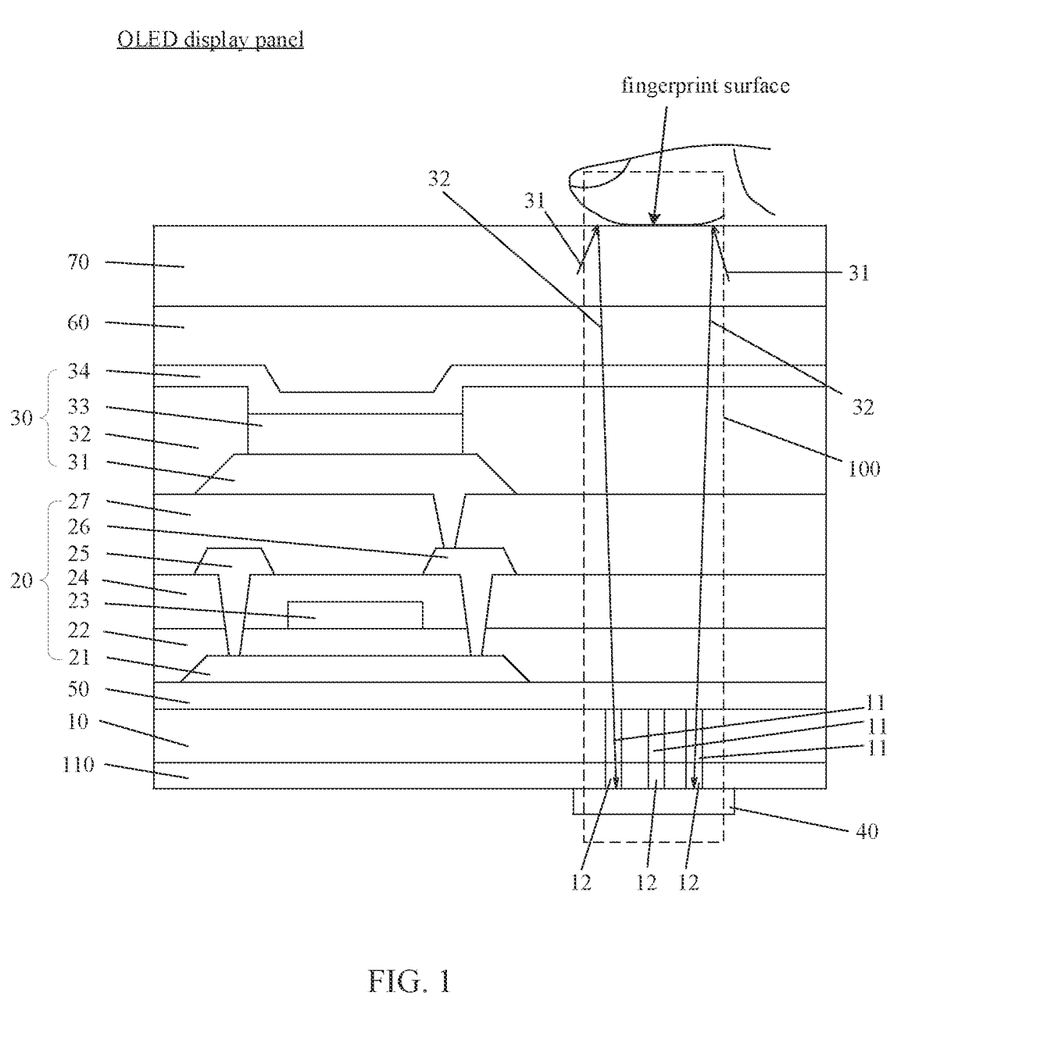
FIG. 1 is a first schematic diagram of an OLED display panel according to an embodiment of the present disclosure.

FIG. 1 is a first schematic diagram of an OLED display panel according to an embodiment of the present disclosure.

The OLED display panel includes a substrate 10, a driving circuit layer 20, a light-emitting material layer 30, a sensing unit 40, a buffer layer 50, an encapsulation layer 60, and a fingerprint identification unit 70. The OLED display panel also includes a fingerprint identifying region 100. In the fingerprint identification region 100, a through hole is formed on the substrate 10.

The substrate 10 is a glass substrate or a flexible substrate. In this embodiment, the substrate 10 is a flexible substrate and made of polyimide.

The buffer layer 50 is formed on one side of the substrate 10. The buffer layer 50 can improve a surface flatness of the substrate 10 when the surface of the substrate 10 is relatively uneven. According to a type of the substrate 10, one or more buffer layers 50 may be formed on the substrate 10, or the buffer layer 50 may not be provided. The buffer layer 115 may be made of an organic material such as at least one of a photoresist, a polyacryl-based resin, a polyimide-based resin, a polyamide-based resin, a siloxane-based resin, an acryl-based resin, and an epoxy-based resin, or the buffer layer 115 may be made of an inorganic material such as at least one of silicon oxide (SiOx), silicon nitride (SiNx), silicon oxynitride (SiOxNy), silicon oxycarbide (SiOxCy), silicon oxynitride (SiCxNy), aluminum oxide (AlOx), aluminum nitride (AlNx), tantalum oxide (TaOx), hafnium oxide (HfOx), zirconium oxide (ZrOx), and titanium oxide (TiOx).

The driving circuit layer 20 is formed on one side of the buffer layer 50 away from the substrate 10. In this embodiment, thin film transistors of the driving circuit layer 20 are a top gate structure. The driving circuit layer 20 includes an active layer 21, a gate insulating layer 22, a gate layer, an interlayer insulating layer 24, a source and drain layer, and a planarization layer 27.

The active layer 21 is disposed on a side of the buffer layer 50 away from the substrate 10. Material of the active layer 21 may be an oxide semiconductor, an inorganic semiconductor, or an organic semiconductor, etc., and may include, for example, at least one of zinc oxide (ZnOx), gallium oxide (GaOx), TiOx, tin oxide (SnOx), indium oxide (InOx), indium gallium oxide (IGO), indium zinc oxide (IZO), indium tin oxide (ITO), gallium zinc oxide (GZO), zinc magnesium oxide (ZMO), zinc tin oxide (ZTO), zinc zirconium oxide (ZnZrxOy), indium gallium zinc oxide (IGZO), indium zinc tin oxide (IZTO), indium gallium germanium oxide (IGHO), tin aluminum zinc oxide (TAZO), indium gallium tin oxide (IGTO), or the like.

The gate insulating layer 22 is formed on a side of the active layer 21 away from the buffer layer 50, and the gate insulating layer 22 may include an organic material or an inorganic material.

The gate layer is formed on a side of the gate insulating layer 22 away from the active layer 21, and is patterned to form a gate 23. Material of the gate 23 may be metal, metal alloy, metal nitride, conductive metal oxide, transparent conductive material, etc., such as at least one of gold (Au), silver (Ag), aluminum (Al), aluminum alloy, aluminum nitride (AlNx), silver alloy, tungsten (W), tungsten nitride (WNx), copper (Cu), copper alloy, nickel (Ni), chromium (Cr), chromium nitride (CrNx), molybdenum (Mo), molybdenum alloy, Ti, titanium nitride (TiNx), platinum (Pt), tantalum (Ta), tantalum nitride (TaNx), tantalum (Nd), strontium (Sc), strontium oxide (SRO), zinc oxide (ZnOx), SnOx, InOx, GaOx, ITO, IZO, and the like.

In one embodiment, the gate 23 may have a multi-layered structure, for example, including a first gate (not shown) and a second gate (not shown) that are disposed layer-by-layer. Also, the gate insulating layer 22 also includes a first gate insulating layer (not shown) and a second gate insulating layer (not shown). The first gate insulating layer is formed on a side of the active layer 21 away from the buffer layer 21. The first gate is formed on a side of the first gate insulating layer away from the active layer 21. The second gate insulating layer is formed on a side of the first gate away from the first gate insulating layer. The second gate is formed on a side of the second gate insulating layer away from the first gate.

The interlayer insulating layer 24 is formed on a side of the gate 23 away from the gate insulating layer 22. Material of the interlayer insulating layer 24 may be at least one of silicon oxide (SiOx), silicon nitride (SiNx), silicon oxynitride (SiOxNy), silicon oxycarbide (SiOxCy), silicon carbonitride (SiCxNy), hafnium oxide (HfOx), aluminum oxide (AlOx), zirconium oxide (ZrOx), titanium oxide (TiOx), and tantalum oxide (TaOx).

The source and drain layer is formed on a side of the interlayer insulating layer 24 away from the gate 23, and is patterned to form a source 25 and a drain 26. Materials of the source 25 and the drain 26 may be metals, alloys, metal nitrides, conductive metal oxides, or transparent conductive materials, for example, may include at least one of aluminum (Al), aluminum alloy, aluminum nitride (AlNx), silver (Ag), silver alloy, tungsten (W), tungsten nitride (WNx), copper (Cu), copper alloy, nickel (Ni), chromium (Cr), chromium nitride (CrNx), molybdenum (Mo), molybdenum alloy, titanium (Ti), titanium nitride (TiNx), platinum (Pt), tantalum (Ta), tantalum nitride (TaNx), niobium (Nd), antimony (Sc), antimony oxide (SRO), zinc oxide (ZnOx), indium tin oxide (ITO), tin oxide (SnOx), indium oxide (InOx), gallium oxide (GaOx), and indium zinc oxide (IZO).

The active layer 21 includes a source region corresponding to the source 25, a drain region corresponding to the drain 26, and a channel region between the source region and the drain region (not shown in the drawings). In the source region, the gate insulating layer 23 and the interlayer insulating layer 24 are formed with via holes. The source 25 is connected to the active layer 21 through the via holes. In the drain region, the gate insulating layer 23 and the interlayer insulating layer 24 are also formed with via holes. The drain 26 is connected to the active layer 21 through the via holes.

The planarization layer 27 is formed on a side of the source 25 and the drain 26 away from the interlayer insulating layer 24, and the planarization layer 27 may made of an organic material or an inorganic material.

The light-emitting material layer 30 includes a pixel electrode 31, a pixel definition layer 32, an organic light-emitting layer 33, and a common electrode 35.

The pixel definition layer 32 has a plurality of opening regions spaced apart from each other. The opening regions refer to through holes which are formed on the pixel definition layer 32 and spaced apart from each other. The opening regions are used to form pixel regions such as red (R) pixel, green (G) pixel, or blue (B) pixel. In each of the opening regions, the pixel electrode 31 is formed on the driving circuit layer 20, and the planarization layer 27 is formed with a via hole, and the pixel electrode 31 is connected to the drain 26 through the via hole.

The organic light-emitting layer 33 is formed on the pixel electrode 31 in the opening region. The common electrode 34 is formed on the organic light-emitting layer 33, and covers the opening regions and non-opening regions. The pixel electrode 31 and the common electrode 34 can drive the organic light-emitting layer 33 to emit light.

The encapsulation layer 60 is disposed on a side of the light-emitting material layer 30 away from the driving circuit layer 20 for isolating water and oxygen and protecting the OLED display panel.

The fingerprint identification unit 70 is disposed on a side of the encapsulation layer 60 away from the light-emitting material layer 30 for receiving fingerprint information. In one embodiment, the fingerprint identification unit 70 is made of a transparent glass.

In the fingerprint identification region 100, the driving circuit layer 20 is not patterned, and the substrate 10 is formed with a through hole. In the embodiment, the substrate 10 is formed with a plurality of first through holes 11 that are not in contact with each other. The plurality of first through holes 11 may have the same size or different sizes.

When a fingerprint identification is processed, the fingerprint is pressed on the fingerprint identification unit 70 in the fingerprint identifying region 100, and an incident light 31 emitted by the light-emitting material layer 30 passes through the encapsulation layer 60 and the fingerprint identification unit 70, and is transmitted to the fingerprint surface, and the light is reflected by the fingerprint surface to form the reflection light 32

Since the driving circuit layer 20 is not patterned, the reflection light 32 directly and sequentially passes through the fingerprint identification unit 70, the encapsulation layer 60, the light-emitting material layer 30, the driving circuit layer 20, the buffer layer 50, and then arrivals the substrate 10. Moreover, it passes through the plurality of first through holes 11 to arrival the sensing unit 40.

The sensing unit 40 is disposed a side of the substrate 10 away from the driving circuit layer 20, and is configured to receive the reflection light 32 reflected by the fingerprint, and compare and analyze the received information with a locally stored fingerprint information. When the received information is consistent with the locally stored fingerprint information, the OLED display panel is controlled to be unlocked.

In one embodiment, the sensing unit 40 is a sensing chip.

In one embodiment, the OLED display panel also includes a protection layer 110 disposed on a side of the substrate 10 away from the driving circuit layer 20. The sensing unit 40 is disposed on a side of the protection layer 110 away from the substrate 10. In the fingerprint identification region 100, the protection layer 110 is formed with a plurality of second through holes 12. The second through holes 12 are in one-to-one correspondence with the first through holes 11, that is, a shape, size and position of the second through holes 12 are the same as those of the first through holes 11.

When the reflection light 32 travels through the first through holes 11 and arrivals the sensing unit 40, the protection layer 110 can prevent stray light from passing through to prevent the stray light from affecting the fingerprint identification performance. Moreover, since the first through holes 11 and the second through holes 12 are formed by etching, the protection layer 110 also protect other layers on the substrate 10 during etching. Material of the protection layer 110 may be silicon oxide (SiOx), silicon nitride (SiNx), molybdenum (Mo), aluminum (Al) or the like.

In the prior art, since the OLED display panel is formed by a multi-layer process. When reflection light 32 passes through each layer to the sensing unit 40, a part of it is lost, and does not all pass through the layers to arrival the sensing unit 40. When the reflection light 32 passes through each layer, it loses most after passing through the substrate 10 of the OLED display panel, which easily causes the loss of the reflection light 32 to affect the fingerprint identification performance.

The present disclosure increases the transmittance of the substrate 10 by forming through holes in the substrate 10 in the fingerprint identifying region 100, so that the reflection light 32 more smoothly passes through the substrate 10 to arrival the sensing unit 40, thereby enhancing a fingerprint unlocking performance.

Figure 2:
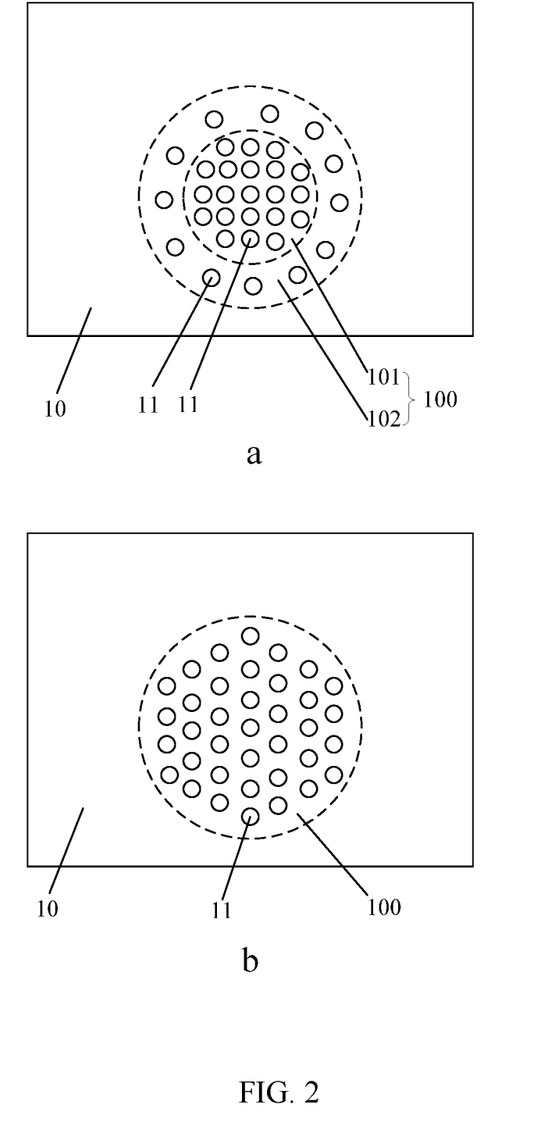
FIG. 2 is a schematic diagram of a substrate of an OLED display panel according to an embodiment of the present disclosure.

In the fingerprint identification region 100, the first through holes 11 are arranged in various manners. FIG. 2 is a schematic diagram of a substrate of an OLED display panel according to an embodiment of the present disclosure.

In one embodiment, as shown in a of FIG. 2, in the fingerprint identifying region 100, the substrate 10 includes a central region 101 and a peripheral region 102, and the peripheral region 102 surrounds the central region 101. A density the first through holes 11 in the central region 101 is greater than a density the first through holes 11 in the peripheral region 102. When the fingerprint is pressed onto the fingerprint identification unit 70, the fingerprint is more complicated and dense corresponding to the central region, so the reflection light 32 reflected to the substrate 10 is also denser corresponding to the central region 101, and less in the peripheral region 102. Thus, the density of the first through holes 11 in the central region 101 is greater than the density of the first through holes 11 in the peripheral region 102, so that the reflection light 32 can be more easily transmitted to the central region 101, and the fingerprint identification performance is better.

In one embodiment, as shown in b of FIG. 2, in the fingerprint identifying region 100, a plurality of first through holes 11 are disposed at equal distances from each other. The reflection light 32 uniformly passes through the substrate 10 to arrival the sensing unit 40.

It should be noted that the fingerprint identifying region 100 is generally circular, but the present disclosure is not limited thereto, and those skilled in the art can set the shape and position of the fingerprint identifying region 100 as needed.

Figure 3:
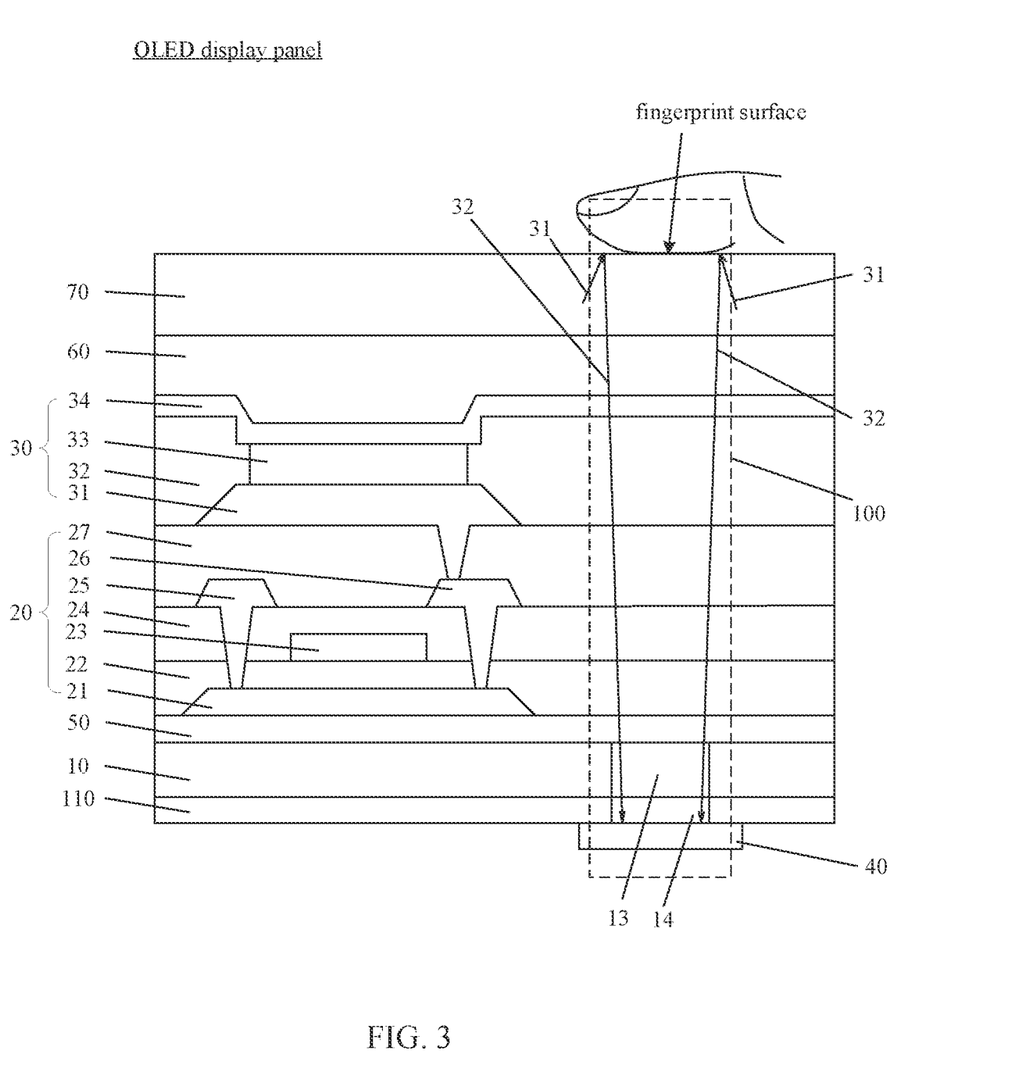
FIG. 3 is a second schematic diagram of an OLED display panel according to an embodiment of the present disclosure.

FIG. 3 is a second schematic diagram of an OLED display panel according to an embodiment of the present disclosure. The OLED display panel includes a substrate 10, a driving circuit layer 20, a light-emitting material layer 30, a sensing unit 40, a buffer layer 50, an encapsulation layer 60, and a fingerprint identification unit 70. The OLED display panel also includes a fingerprint identifying region 100. In the fingerprint identifying region 100, a through hole is formed on the substrate 10.

In this embodiment, in the fingerprint identifying region 100, the driving circuit layer 20 is not patterned, and the substrate 10 is formed with a third through hole 13. The reflection light 32 directly and sequentially passes through the fingerprint identification unit 70, the encapsulation layer 60, the light-emitting material layer 30, the driving circuit layer 20, the buffer layer 50, and then arrivals the substrate 10. Moreover, it passes through the third through hole 13 to arrival the sensing unit 40.

In one embodiment, an area of the third through hole 13 is greater than or equal to an area of the fingerprint identifying region 100, so as to ensure that the reflection light 32 reflected by the fingerprint can pass through as much as possible when passing through the substrate 10, thereby further improving a light transmittance of the OLED display panel, and enhancing the fingerprint unlocking performance.

In one embodiment, the OLED display panel also includes a protection layer 110 disposed on a side of the substrate 10 away from the driving circuit layer 20. The sensing unit 40 is disposed on a side of the protection layer 110 away from the substrate 10. In the fingerprint identification region 100, the protection layer 110 is formed with a fourth through hole 14. The fourth through hole 14 corresponds to the third through hole 13, that is, a shape, size and position of the fourth through hole 14 is the same as those of the third through hole 13.

When the reflection light 32 travels through the third through hole 13 and arrivals the sensing unit 40, the protection layer 110 can prevent stray light from passing through to prevent the stray light from affecting the fingerprint identification performance. Moreover, since the third through hole 13 and the fourth through hole 14 are formed by etching, the protection layer 110 also protect other layers on the substrate 10 during etching. Material of the protection layer 110 may be silicon oxide (SiOx), silicon nitride (SiNx), molybdenum (Mo), aluminum (Al) or the like.

Figure 4:
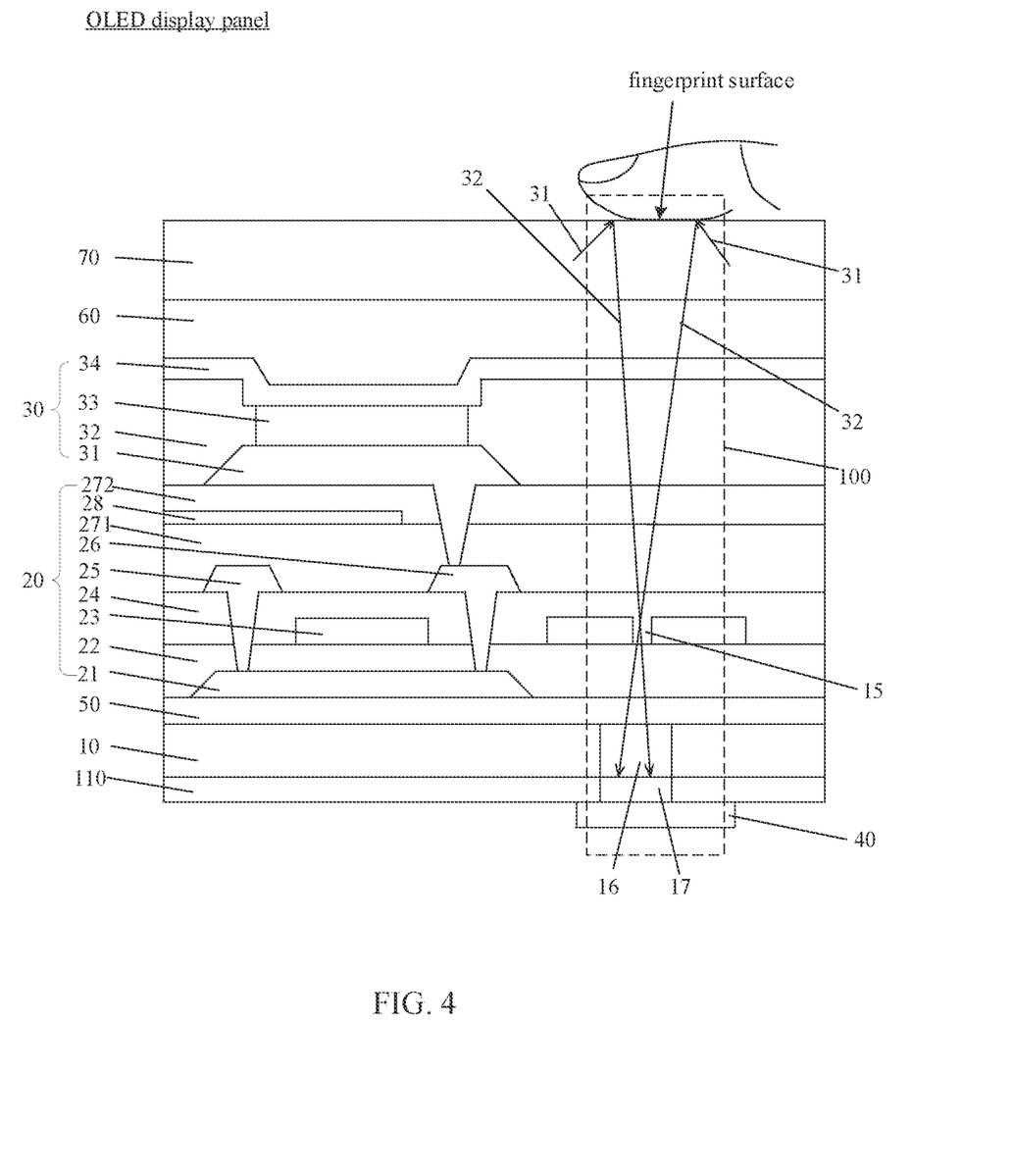
FIG. 4 is a third schematic diagram of an OLED display panel according to an embodiment of the present disclosure.

FIG. 4 is a third schematic diagram of an OLED display panel according to an embodiment of the present disclosure. The OLED display panel includes a substrate 10, a driving circuit layer 20, a light-emitting material layer 30, a sensing unit 40, a buffer layer 50, an encapsulation layer 60, and a fingerprint identification unit 70. The OLED display panel also includes a fingerprint identifying region 100. In the fingerprint identifying region 100, a through hole is formed on the substrate 10.

In this embodiment, thin film transistors of the driving circuit layer 20 are a top gate structure. The driving circuit layer 20 includes an active layer 21, a gate insulating layer 22, a gate layer, an interlayer insulating layer 24, a source and drain layer, a first planarization layer 271, a signal line layer 28, and a second planarization layer 272.

The active layer 21 is disposed on a side of the buffer layer 50 away from the substrate 10. The gate insulating layer 22 is formed on a side of the active layer 21 away from the buffer layer 50. The gate layer is formed on a side of the gate insulating layer 22 away from the active layer 21. The interlayer insulating layer 24 is formed on a side of the gate layer away from the gate insulating layer 22. The source and drain layer is formed on a side of the interlayer insulating layer 24 away from the gate layer. The first planarization layer 271 is formed on a side of the source and drain layer away from the interlayer insulating layer 24. The signal line layer 28 is formed on a side of the first planarization layer 271 away from the source and drain layer. The second planarization layer 272 is formed on a side of the signal line layer 28 away from the signal line layer 28.

In the fingerprint identifying region 100, the driving circuit layer 20 is patterned to form a fifth through hole 15. The substrate is formed with a sixth through hole 16. The light-emitting material layer 30 emits an incident light 31 which is reflected by the fingerprint surface to form a reflection light 32. The reflection light 32 travels through the fifth through hole 15 and arrivals the sixth through hole 16 and the sensing unit 40 according to a pinhole imaging theory.

In this embodiment, the fifth through hole 15 is formed with the gate layer. The other film layers were not patterned in the fingerprint identifying region 100. The gate layer is patterned to form a gate 23 of the OLED display panel in a non-finger identification region and a fifth through hole 15 in the fingerprint identifying region 100. An area of the fifth through hole 15 is much smaller than an area of the fingerprint identifying region 100.

The gate layer may have a multi-layered structure, for example, including a first gate layer (not shown) and a second gate layer (not shown) that are disposed layer-by-layer. Also, the gate insulating layer 22 also includes a first gate insulating layer (not shown) and a second gate insulating layer (not shown). The first gate insulating layer is formed on a side of the active layer 21 away from the buffer layer 21. The first gate layer is formed on a side of the first gate insulating layer away from the active layer 21. The second gate insulating layer is formed on a side of the first gate layer away from the first gate insulating layer. The second gate layer is formed on a side of the second gate insulating layer away from the first gate layer In one embodiment, the fifth through hole 15 is formed with the first gate layer.

In one embodiment, the fifth through hole 15 is formed with the second gate layer.

When a fingerprint identification is processed, the fingerprint is pressed on the fingerprint identification unit 70 in the fingerprint identifying region 100, and an incident light 31 emitted by the light-emitting material layer 30 passes through the encapsulation layer 60 and the fingerprint identification unit 70, and is transmitted to the fingerprint surface, and the light is reflected by the fingerprint surface to form the reflection light 32.

The driving circuit layer 20 is patterned to form the fifth through hole 15, and an area of the fifth through hole 15 is smaller than an area of the fingerprint identifying region 100. The reflection light 32 directly and sequentially passes through the fingerprint identification unit 70, the encapsulation layer 60, and the light-emitting material layer 30, and then arrivals the fifth through hole 15 of the driving circuit layer 20. An image of the fingerprint will be reversed. The reflection light 32 with the reversed fingerprint information passes through the buffer layer 50 and reaches the substrate 10. Then, the light passes through the sixth through hole 16 to arrival the sensing unit 40.

The fifth through hole 15 functions as a small hole of the pinhole imaging theory in a transmission path of the reflection light 32. Also, the fifth through hole 15 is formed on the driving circuit layer 20. A distance between the fifth through hole 15 and the substrate 10 is smaller than a distance between the fifth through hole 15 and the fingerprint identification unit 70. Therefore, after the reflection light 32 passes through the fifth through hole 15, the image of the fingerprint formed on the substrate 10 is small, and the definition of the image is high. In the fingerprint identifying region 100, an area of the sixth through hole 16 formed on the substrate 10 can be smaller than an area of the fingerprint identifying region 100, thereby avoiding an influence of excessive through hole on the substrate 10 and the OLED display panel.

The sensing unit 40 is disposed a side of the substrate 10 away from the driving circuit layer 20, and is configured to receive the reflection light 32 reflected by the fingerprint, and compare and analyze the received information with a locally stored fingerprint information. When the received information is consistent with the locally stored fingerprint information, the OLED display panel is controlled to be unlocked.

In one embodiment, the sensing unit 40 is a sensing chip.

In one embodiment, the OLED display panel also includes a protection layer 110 disposed on a side of the substrate 10 away from the driving circuit layer 20. The sensing unit 40 is disposed on a side of the protection layer 110 away from the substrate 10. In the fingerprint identification region 100, the protection layer 110 is formed with a seventh through hole 17. The seventh through hole 17 corresponds to the sixth through hole 16, that is, a shape, size and position of the seventh through hole 17 is the same as those of the sixth through hole 16.

When the reflection light 32 travels through the first through holes 11 and arrivals the sensing unit 40, the protection layer 110 can prevent stray light from passing through to prevent the stray light from affecting the fingerprint identification performance. Moreover, since the sixth through hole 16 and the seventh through hole 17 are formed by etching, the protection layer 110 also protect other layers on the substrate 10 during etching. Material of the protection layer 110 may be silicon oxide (SiOx), silicon nitride (SiNx), molybdenum (Mo), aluminum (Al) or the like.

The present disclosure increases the transmittance of the substrate 10 by forming through hole in the substrate 10 in the fingerprint identifying region 100, so that the reflection light 32 more smoothly passes through the substrate 10 to arrival the sensing unit 40, thereby enhancing a fingerprint unlocking performance.

Figure 5:
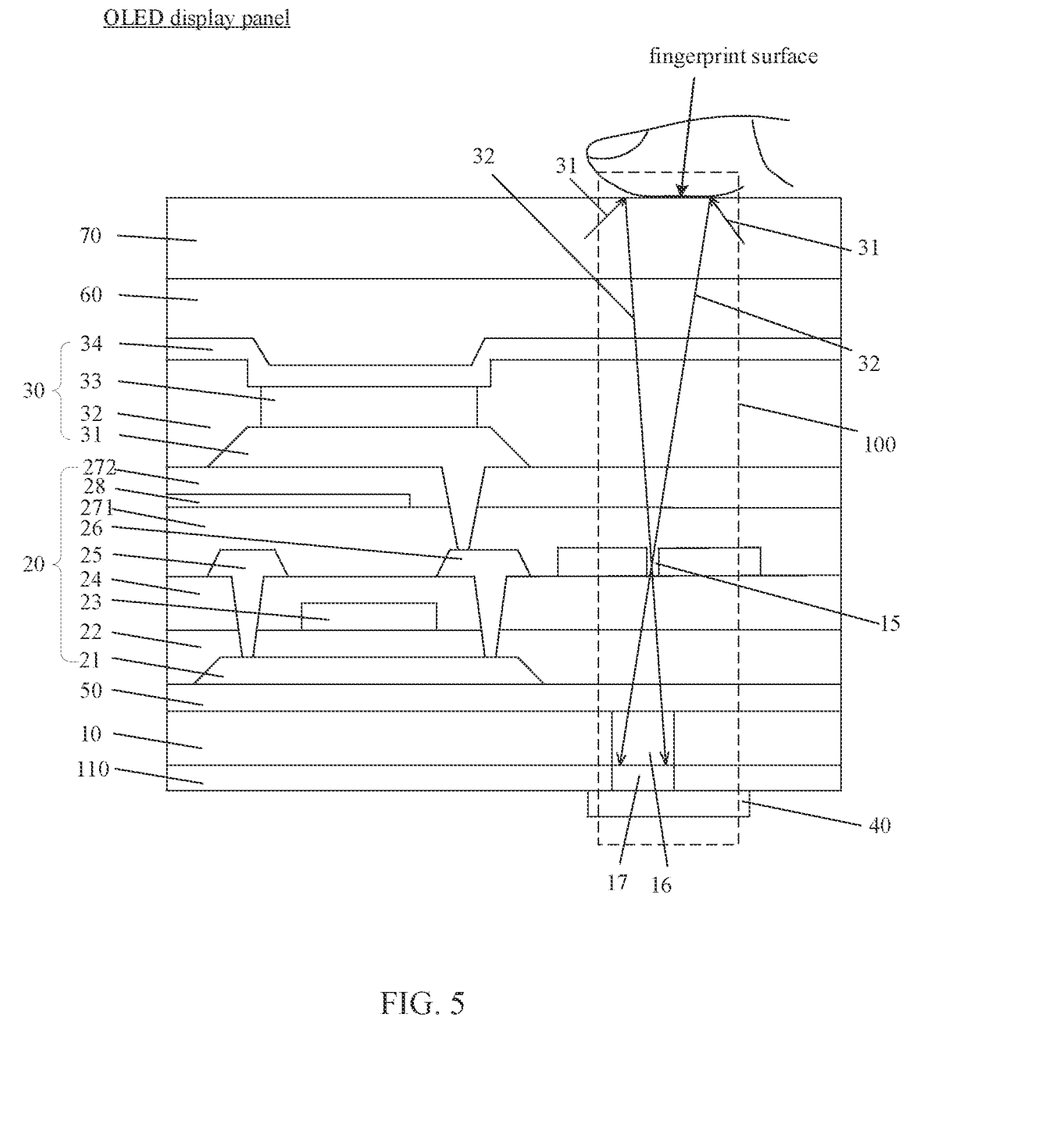
FIG. 5 is a fourth schematic diagram of an OLED display panel according to an embodiment of the present disclosure.

FIG. 5 is a fourth schematic diagram of an OLED display panel according to an embodiment of the present disclosure. The OLED display panel includes a substrate 10, a driving circuit layer 20, a light-emitting material layer 30, a sensing unit 40, a buffer layer 50, an encapsulation layer 60, and a fingerprint identification unit 70. The OLED display panel also includes a fingerprint identifying region 100. In the fingerprint identifying region 100, a through hole is formed on the substrate 10.

In this embodiment, thin film transistors of the driving circuit layer 20 are a top gate structure. The driving circuit layer 20 includes an active layer 21, a gate insulating layer 22, a gate layer, an interlayer insulating layer 24, a source and drain layer, a first planarization layer 271, a signal line layer 28, and a second planarization layer 272.

The present embodiment is different from the structure in FIG. 4 in that the fifth through hole 15 is formed with the source and drain layer, and the other layers are not patterned in the fingerprint identifying region 100. The source and drain layer is patterned. The source 25 and the drain 26 of the OLED display panel are formed in the non-finger identification region, and the fifth through hole 15 is formed in the fingerprint identification region 100. An area of the fifth through hole 15 is much smaller than an area of the fingerprint identifying region 100.

The fifth through hole 15 functions as a small hole of the pinhole imaging theory in a transmission path of the reflection light 32. Also, the fifth through hole 15 is formed on the driving circuit layer 20. A distance between the fifth through hole 15 and the substrate 10 is smaller than a distance between the fifth through hole 15 and the fingerprint identification unit 70. Therefore, after the reflection light 32 passes through the fifth through hole 15, the image of the fingerprint formed on the substrate 10 is small, and the definition of the image is high. In the fingerprint identifying region 100, an area of the sixth through hole 16 formed on the substrate 10 can be smaller than an area of the fingerprint identifying region 100, thereby avoiding an influence of excessive through hole on the substrate 10 and the OLED display panel.

In one embodiment, the OLED display panel also includes a protection layer 110 disposed on a side of the substrate 10 away from the driving circuit layer 20. The sensing unit 40 is disposed on a side of the protection layer 110 away from the substrate 10. In the fingerprint identification region 100, the protection layer 110 is formed with a seventh through hole 17. The seventh through hole 17 corresponds to the sixth through hole 16, that is, a shape, size and position of the seventh through hole 17 is the same as those of the sixth through hole 16.

When the reflection light 32 travels through the first through holes 11 and arrivals the sensing unit 40, the protection layer 110 can prevent stray light from passing through to prevent the stray light from affecting the fingerprint identification performance. Moreover, since the sixth through hole 16 and the seventh through hole 17 are formed by etching, the protection layer 110 also protect other layers on the substrate 10 during etching. Material of the protection layer 110 may be silicon oxide (SiOx), silicon nitride (SiNx), molybdenum (Mo), aluminum (Al) or the like.

The present disclosure increases the transmittance of the substrate 10 by forming through hole in the substrate 10 in the fingerprint identifying region 100, so that the reflection light 32 more smoothly passes through the substrate 10 to arrival the sensing unit 40, thereby enhancing a fingerprint unlocking performance.

Figure 6:
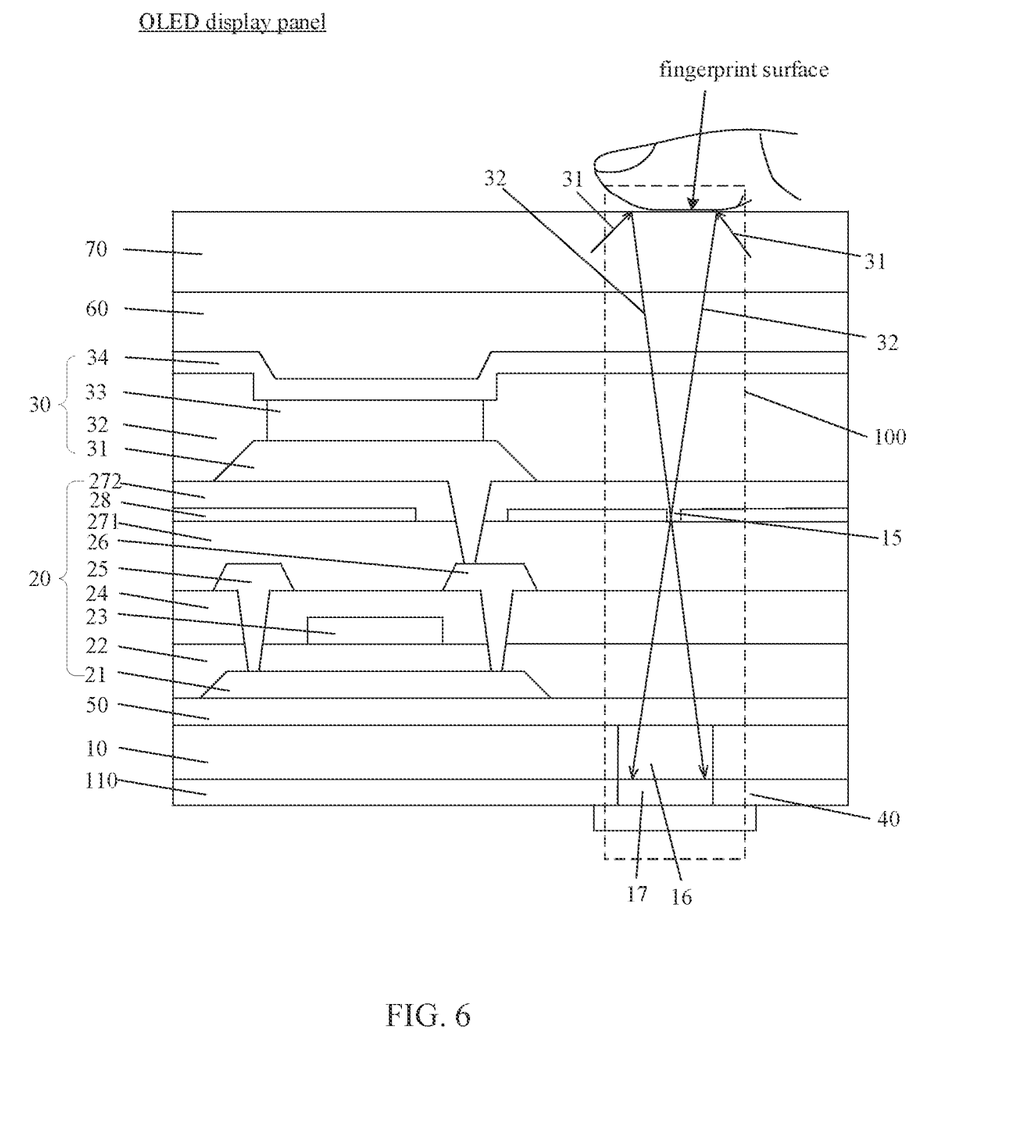
FIG. 6 is a fifth schematic diagram of an OLED display panel according to an embodiment of the present disclosure.

FIG. 6 is a fifth schematic diagram of an OLED display panel according to an embodiment of the present disclosure. The OLED display panel includes a substrate 10, a driving circuit layer 20, a light-emitting material layer 30, a sensing unit 40, a buffer layer 50, an encapsulation layer 60, and a fingerprint identification unit 70. The OLED display panel also includes a fingerprint identifying region 100. In the fingerprint identifying region 100, a through hole is formed on the substrate 10.

In this embodiment, thin film transistors of the driving circuit layer 20 are a top gate structure. The driving circuit layer 20 includes an active layer 21, a gate insulating layer 22, a gate layer, an interlayer insulating layer 24, a source and drain layer, a first planarization layer 271, a signal line layer 28, and a second planarization layer 272.

The present embodiment is different from the structure in FIG. 4 in that the fifth through hole 15 is formed with the signal line layer 28, and the other layers are not patterned in the fingerprint identifying region 100. In the non-fingerprint identifying region, the signal line layer 28 is connected to a power supply of the OLED display panel. The fifth through hole 15 is formed in the fingerprint identification region 100. An area of the fifth through hole 15 is much smaller than an area of the fingerprint identifying region 100.

The fifth through hole 15 functions as a small hole of the pinhole imaging theory in a transmission path of the reflection light 32. Also, the fifth through hole 15 is formed on the driving circuit layer 20. A distance between the fifth through hole 15 and the substrate 10 is smaller than a distance between the fifth through hole 15 and the fingerprint identification unit 70. Therefore, after the reflection light 32 passes through the fifth through hole 15, the image of the fingerprint formed on the substrate 10 is small, and the definition of the image is high. In the fingerprint identifying region 100, an area of the sixth through hole 16 formed on the substrate 10 can be smaller than an area of the fingerprint identifying region 100, thereby avoiding an influence of excessive through hole on the substrate 10 and the OLED display panel.

In one embodiment, the OLED display panel also includes a protection layer 110 disposed on a side of the substrate 10 away from the driving circuit layer 20. The sensing unit 40 is disposed on a side of the protection layer 110 away from the substrate 10. In the fingerprint identification region 100, the protection layer 110 is formed with a seventh through hole 17. The seventh through hole 17 corresponds to the sixth through hole 16, that is, a shape, size and position of the seventh through hole 17 is the same as those of the sixth through hole 16.

When the reflection light 32 travels through the first through holes 11 and arrivals the sensing unit 40, the protection layer 110 can prevent stray light from passing through to prevent the stray light from affecting the fingerprint identification performance. Moreover, since the sixth through hole 16 and the seventh through hole 17 are formed by etching, the protection layer 110 also protect other layers on the substrate 10 during etching. Material of the protection layer 110 may be silicon oxide (SiOx), silicon nitride (SiNx), molybdenum (Mo), aluminum (Al) or the like.

The present disclosure increases the transmittance of the substrate 10 by forming through hole in the substrate 10 in the fingerprint identifying region 100, so that the reflection light 32 more smoothly passes through the substrate 10 to arrival the sensing unit 40, thereby enhancing a fingerprint unlocking performance.

The present disclosure also provides a display device including an OLED display panel. The OLED display panel includes a substrate, a driving circuit layer, a light-emitting material layer, and a sensing unit. The driving circuit layer is formed on a side of the substrate. The light-emitting material layer is formed on a side of the driving circuit layer away from the substrate. The sensing unit is disposed on another side of the substrate away from the driving circuit layer and configured to receive light reflected by a fingerprint surface. In a fingerprint identifying region of the OLED display panel, the substrate includes a through hole, and the light emitted from the light-emitting material layer and reflected by the fingerprint surface travels through the through hole and arrivals the sensing unit.

In one embodiment, in the fingerprint identifying region, the driving circuit layer is unpatterned.

In one embodiment, in the fingerprint identifying region, the substrate includes a plurality of first through holes that are not in contact with each other.

In one embodiment, in the fingerprint identifying region, the substrate includes a central region and a peripheral region, and the peripheral region surrounds the central region, and a density of the first through holes in the central region is greater than a density of the first through holes in the peripheral region.

In one embodiment, the plurality of first through holes are disposed at equal distances from each other.

In one embodiment, the OLED display panel also includes a protection layer disposed on the another side of the substrate away from the driving circuit layer, and in the fingerprint identification region, the protection layer includes a plurality of second through holes which are in one-to-one correspondence with the first through holes.

In one embodiment, in the fingerprint identification region, the substrate includes a third through hole.

In one embodiment, the OLED display panel also includes a protection layer disposed on the another side of the substrate away from the driving circuit layer, and in the fingerprint identification region, the protection layer includes a fourth through hole corresponding to the third through hole.

In one embodiment, the driving circuit layer includes a gate layer, a source and drain layer, and a signal line layer, and in the fingerprint identifying region, the driving circuit layer is patterned to form a fifth through hole, and the substrate includes a sixth through hole, and the light emitted from the light-emitting material layer and reflected by the fingerprint surface travels through the fifth through hole and arrivals the sixth through hole and the sensing unit according to a pinhole imaging theory.

In one embodiment, the fifth through hole is formed with the gate layer.

In one embodiment, the gate layer includes a first gate layer and a second gate layer, and the fifth through hole is formed with the first gate layer.

In one embodiment, the gate layer includes a first gate layer and a second gate layer, and the fifth through hole is formed with the first gate layer.

In one embodiment, the fifth through hole is formed with the source and drain layer.

In one embodiment, the fifth through hole is formed with the signal line layer.

In one embodiment, the OLED display panel also includes a protection layer disposed on the another side of the substrate away from the driving circuit layer, and in the fingerprint identification region, the protection layer includes a seventh through hole corresponding to the sixth through hole.

According to the above embodiments, the following is known.

The present disclosure provides the OLED display panel and the display device. The OLED display panel includes the substrate, the driving circuit layer, the light-emitting material layer, and the sensing unit. The driving circuit layer is formed on a side of the substrate. The light-emitting material layer is formed on a side of the driving circuit layer away from the substrate. The sensing unit is disposed on another side of the substrate away from the driving circuit layer and configured to receive light reflected by the fingerprint surface. In the fingerprint identifying region of the OLED display panel, the substrate includes a through hole. The light emitted from the light-emitting material layer and reflected by the fingerprint surface travels through the through hole and arrivals the sensing unit. By forming the through hole on the substrate corresponding to the fingerprint identification region, a transmittance of the substrate in the fingerprint identifying region is increased, so that a path loss of the light emitted by the light-emitting material layer and reduced by the fingerprint surface to the sensing unit is reduced, thereby enhancing a performance of fingerprint identification.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the appended claims.

What is claimed is:

1. An organic light-emitting diode (OLED) display panel, comprising:
   a substrate;
   a driving circuit layer formed on a side of the substrate;
   a light-emitting material layer formed on a side of the driving circuit layer away from the substrate; and
   a sensing unit disposed on another side of the substrate away from the driving circuit layer and configured to receive light reflected by a fingerprint surface;
   wherein in a fingerprint identifying region of the OLED display panel, the substrate comprises a through hole, and the light emitted from the light-emitting material layer and the light reflected by the fingerprint surface travels through the through hole and arrivals the sensing unit;
   wherein in the fingerprint identifying region, the driving circuit layer is unpatterned;
   wherein in the fingerprint identifying region, the substrate comprises a plurality of first through holes that are not in contact with each other; and
   wherein in the fingerprint identifying region, the substrate comprises a central region and a peripheral region, and the peripheral region surrounds the central region, and a density of the first through holes in the central region is greater than a density of the first through holes in the peripheral region.

2. The OLED display panel as claimed in claim 1, wherein the OLED display panel further comprises a protection layer disposed on the another side of the substrate away from the driving circuit layer, and in the fingerprint identification region, the protection layer comprises a plurality of second through holes which are in one-to-one correspondence with the first through holes.

3. An organic light-emitting diode (OLED) display panel, comprising:
   a substrate;
   a driving circuit layer formed on a side of the substrate;
   a light-emitting material layer formed on a side of the driving circuit layer away from the substrate; and
   a sensing unit disposed on another side of the substrate away from the driving circuit layer and configured to receive light reflected by a fingerprint surface;
   wherein in a fingerprint identifying region of the OLED display panel, the substrate comprises a through hole, and the light emitted from the light-emitting material layer and the light reflected by the fingerprint surface travels through the through hole and arrivals the sensing unit; and
   wherein the driving circuit layer comprises a gate layer, a source and drain layer, and a signal line layer, and in the fingerprint identifying region, the driving circuit layer is patterned to form a fifth through hole, and the substrate comprises a sixth through hole, and the light emitted from the light-emitting material layer and the light reflected by the fingerprint surface travels through the fifth through hole and arrivals the sixth through hole and the sensing unit according to a pinhole imaging theory.

4. The OLED display panel as claimed in claim 3, wherein the fifth through hole is formed with the gate layer.

5. The OLED display panel as claimed in claim 3, wherein the gate layer comprises a first gate layer and a second gate layer, and the fifth through hole is formed with the first gate layer.

6. The OLED display panel as claimed in claim 3, wherein the fifth through hole is formed with the signal line layer.

7. The OLED display panel as claimed in claim 3, wherein the fifth through hole is formed with the source and drain layer.

8. The OLED display panel as claimed in claim 3, wherein the OLED display panel further comprises a protection layer disposed on the another side of the substrate away from the driving circuit layer, and in the fingerprint identification region, the protection layer comprises a seventh through hole corresponding to the sixth through hole.

9. A display device comprising an organic light-emitting diode (OLED) display panel, wherein the OLED display panel comprises:
   a substrate;
   a driving circuit layer formed on a side of the substrate;
   a light-emitting material layer formed on a side of the driving circuit layer away from the substrate; and
   a sensing unit disposed on another side of the substrate away from the driving circuit layer and configured to receive light reflected by a fingerprint surface;
   wherein in a fingerprint identifying region of the OLED display panel, the substrate comprises a through hole, and the light emitted from the light-emitting material layer and the light reflected by the fingerprint surface travels through the through hole and arrivals the sensing unit; and
   wherein the driving circuit layer comprises a gate layer, a source and drain layer, and a signal line layer, and in the fingerprint identifying region, the driving circuit layer is patterned to form a fifth through hole, and the substrate comprises a sixth through hole, and the light emitted from the light-emitting material layer and the light reflected by the fingerprint surface travels through the fifth through hole and arrivals the sixth through hole and the sensing unit according to a pinhole imaging theory.

10. The display device as claimed in claim 9, wherein in the fingerprint identifying region, the driving circuit layer is unpatterned.

11. The display device as claimed in claim 10, wherein in the fingerprint identifying region, the substrate comprises a plurality of first through holes that are not in contact with each other.

12. The display device as claimed in claim 10, wherein in the fingerprint identification region, the substrate comprises a third through hole.

* * * * *